United States Patent [19]
Humphreys et al.

[11] Patent Number: 5,793,825
[45] Date of Patent: Aug. 11, 1998

[54] METHOD AND APPARATUS FOR EXTENDING AN OPERATING FREQUENCY RANGE OF AN INSTANTANEOUS PHASE-FREQUENCY DETECTOR

[75] Inventors: Scott Robert Humphreys, Boynton Beach; Raymond Louis Barrett, Jr., Ft. Lauderdale; Barry W. Herold, Boca Raton, all of Fla.

[73] Assignee: Motorola, Inc., Schaumburg, Ill.

[21] Appl. No.: 610,034

[22] Filed: Mar. 4, 1996

[51] Int. Cl.$^6$ .................. H03D 3/24; H04L 27/14; H03L 7/00
[52] U.S. Cl. .................. 375/375; 375/324; 375/376; 331/25
[58] Field of Search ............. 331/25, 2, 1, 14; 327/150, 7, 159, 156, 147, 3, 43, 158, 141, 5; 375/376, 324, 375, 326, 327

[56] References Cited

U.S. PATENT DOCUMENTS 4,167,711  9/1979  Smoot .
4,916,403  4/1990  Sudoh et al. .................. 331/25
5,128,632  7/1992  Erhart et al. .................. 331/1
5,552,750  9/1996  Barrett, Jr. et al. ............ 331/25
5,610,558  3/1997  Mittel et al. .................. 331/2

*Primary Examiner*—Stephen Chin
*Assistant Examiner*—Shuwang Liu
*Attorney, Agent, or Firm*—James A. Lamb

[57] ABSTRACT

A method is used by a detector (102) for extending the operating frequency range of a phase lock loop (100). The detector (102) detects a phase-frequency difference between a reference signal (109) and a generated signal (108) of the phase lock loop (100). The detector (102) includes a divider (202) for counting transitions of the generated signal (108) and a logic element (204) and counter (212) for detecting when the frequency of the generated signal (108) is such that the divider (202) operates outside its linear frequency range in relation to a predetermined transition of the reference signal (109). The detector (102) further includes a register (206) for recording a phase value of the divider (202) coincident with the predetermined transition, or a constant phase value (304, 306) when the frequency of the generated signal (108) is operating outside of the linear range of the divider (202).

24 Claims, 5 Drawing Sheets

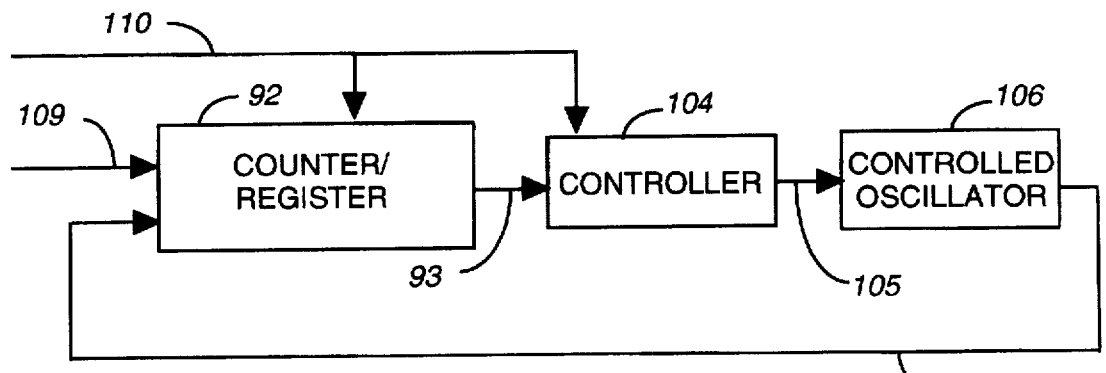
FIG. 1 *PRIOR ART*
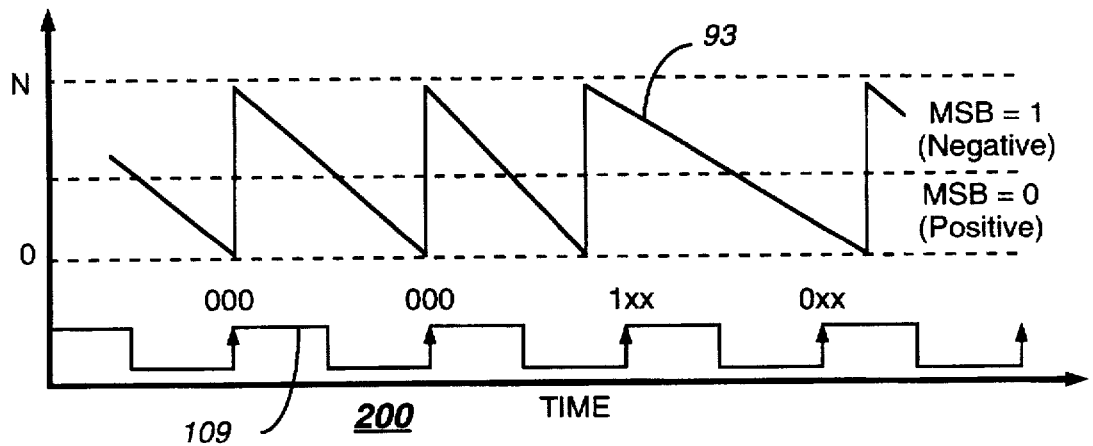
FIG. 2 *PRIOR ART*
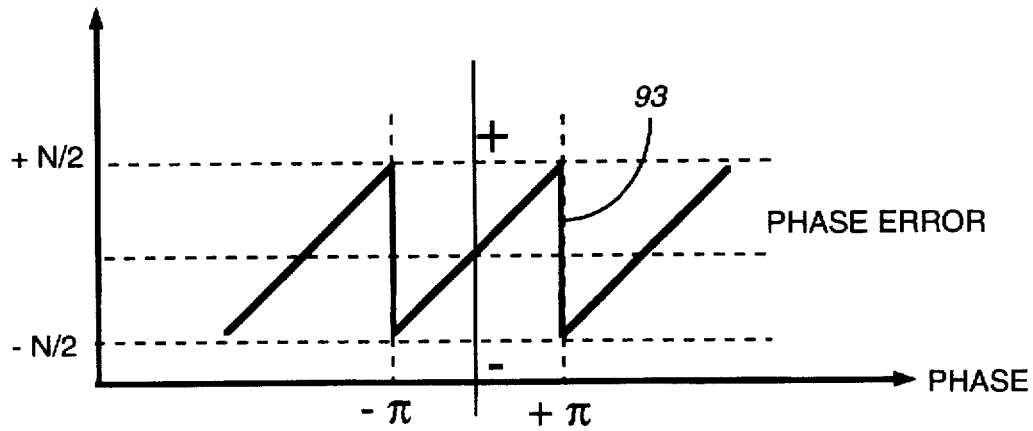
FIG. 3 *PRIOR ART*

METHOD AND APPARATUS FOR EXTENDING AN OPERATING FREQUENCY RANGE OF AN INSTANTANEOUS PHASE-FREQUENCY DETECTOR

RELATED APPLICATIONS

U.S. Pat. application Ser. No. 08/523,665 filed Sep. 5, 1995 by Barrett et al., entitled "Method And Apparatus for Determining an Instantaneous Phase Difference Between Two Signals".

U.S. Pat. application Ser. No. 08/567,387 filed Dec. 4, 1995 by Barrett et al., entitled "Hybrid Analog Digital Phase Error Detector".

U.S. Pat. application Ser. No. 08/556,882 filed Nov. 2, 1995 by Herold et al., entitled "Discrete Time Digital Phase Locked Loop".

Attorney Docket No. PT00016Q, mailed Nov. 30, 1995 by Barrett et al., entitled "Method and Apparatus for Generating Multiple Signals at Multiple Frequencies".

FIELD OF THE INVENTION

This invention relates in general to phase lock loops, and more specifically to a method and apparatus for extending an operating frequency range of an instantaneous phase-frequency detector.

BACKGROUND OF THE INVENTION

Prior art systems employing instantaneous phase detectors have utilized digital signal processing techniques for measuring instantaneous phase differences between a reference signal and a generated signal of the phase lock loop. These techniques have provided an adequate method for measuring phase differences over the operating frequency range of the phase lock loop.

Although this technique has proven effective, the operating frequency range of prior art instantaneous phase detectors is substantially limited for practical operations. To compensate for the limited operating frequency range, special circuits are added to bias the phase lock loop in a manner that allows for a proper power-up sequence as well as a wider range for frequency adjustment. These additional circuits result in a more complex phase lock loop structure that is susceptible to manufacturing defects, especially for integrated circuit designs.

Thus, what is needed is a method and apparatus for extending the operating frequency range of an instantaneous phase detector. In particular, the operating frequency range must extend to all frequencies in order to allow a proper power-up sequence and a wider frequency adjustment range of the phase lock loop.

SUMMARY OF THE INVENTION

An aspect of the present invention is a method for extending an operating frequency range of an instantaneous phase-frequency detector having a divider, a counter, and a register. The method comprises the steps of configuring the instantaneous phase-frequency detector such that a divider count of zero in the divider corresponds to a zero phase error between a generated signal operating at a generated frequency and a reference signal operating at a reference frequency, and recording in the counter a transition count determined by how many transitions of a predetermined direction occur in a most significant bit of the divider during a cycle of the reference signal. The method further comprises the steps of writing into the register a first phase error value corresponding to the divider count coincident with a predetermined transition of the reference signal, in response to the transition count being equal to unity, and writing into the register a second phase error value based upon the transition count, in response to the transition count being different from unity.

A second aspect of the present invention is an instantaneous phase-frequency detector having an extended operating frequency range. The detector comprises a divider coupled to a generated signal operating at a generated frequency for counting transitions of the generated signal, the divider configured such that a divider count of zero corresponds to a zero phase error between the generated signal and a reference signal operating at a reference frequency, and a logic element coupled to the divider and coupled to a counter for controlling the logic element. The counter is coupled to the divider for recording a transition count determined by how many transitions of a predetermined direction occur in a most significant bit of the divider during a cycle of the reference signal. The detector further comprises a register coupled to the logic element for receiving a first phase error value corresponding to the divider count coincident with a predetermined transition of the reference signal, in response to the transition count being equal to unity, wherein the logic element is controlled by the counter to write to the register a second phase error value based upon the transition count, in response to the transition count being different from unity.

A third aspect of the present invention is a phase lock loop having an extended operating frequency range. The phase lock loop comprises a controlled oscillator for generating a generated signal operating at a generated frequency, a controller coupled to the controlled oscillator for controlling the controlled oscillator, and an instantaneous phase-frequency detector. The instantaneous phase-frequency detector comprises a divider coupled to controlled oscillator for counting transitions of the generated signal, the divider configured such that a divider count of zero corresponds to a zero phase error between the generated signal and a reference signal operating at a reference frequency, and a logic element coupled to the divider and coupled to a counter for controlling the logic element. The counter is coupled to the divider for recording a transition count determined by how many transitions of a predetermined direction occur in a most significant bit of the divider during a cycle of the reference signal. The instantaneous phase-frequency detector further comprises a register coupled to the logic element for receiving a first phase error value corresponding to the divider count coincident with a predetermined transition of the reference signal, in response to the transition count being equal to unity, the register further coupled to the controller for delivering the phase error value thereto, wherein the logic element is controlled by the counter to write to the register a second phase error value based upon the transition count, in response to the transition count being different from unity.

A fourth aspect of the present invention is a method for extending an operating frequency range of an instantaneous phase-frequency detector including a counter, a register, and a divider having a resolution. The method comprises the steps of configuring the instantaneous phase-frequency detector such that a predetermined value of a divider count in the divider corresponds to a zero phase error between a generated signal operating at a generated frequency and a reference signal operating at a reference frequency; and recording in the counter a pass count determined by how many times the divider count passes through a count equal to the predetermined value, offset by one-half the resolution of the divider, during a cycle of the reference signal. The method further comprises writing into the register a first phase error value corresponding to the divider count coincident with a predetermined transition of the reference signal, in response to the pass count being equal to unity; and writing into the register a second phase error value based upon the pass count, in response to the pass count being different from unity.

BRIEF DESCRIPTION OF THE DRAWINGS

FIG. 1 is an electrical block diagram of a prior art phase lock loop.

FIG. 2 is a timing diagram depicting the normal, locked and near-locked operation of a counter which serves as an instantaneous phase-frequency detector in the prior art phase lock loop.

FIG. 3 is a phase error diagram depicting operation of the counter in the prior art phase lock loop.

DESCRIPTION OF THE PREFERRED EMBODIMENT

Figure 4:
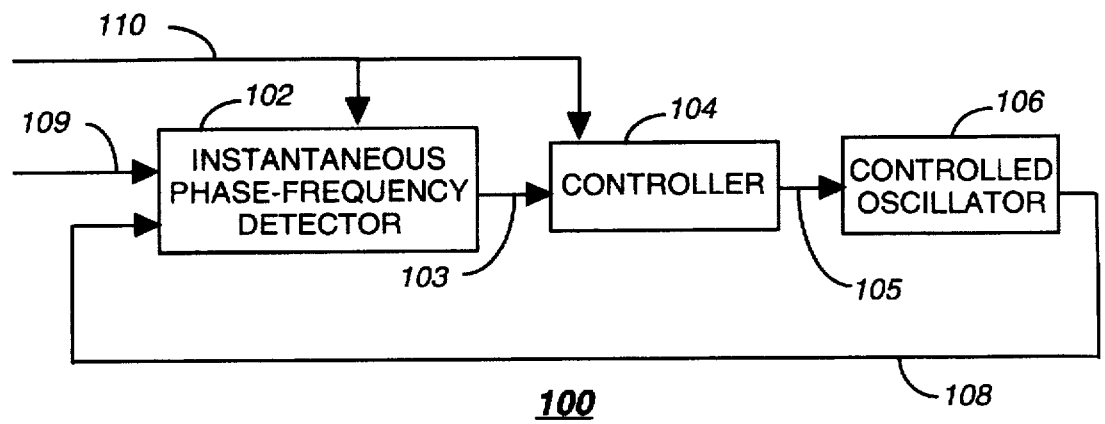
FIG. 4 is an electrical block diagram of a phase lock loop in accordance with the preferred embodiment of the present invention.

FIG. 1 is an electrical block diagram of a prior art phase lock loop 90. The phase lock loop 90 operates to phase lock a reference signal 109 operating at a reference frequency to a generated signal 108 operating at a generated frequency. The reference signal 109 is derived from, for example, a conventional reference crystal oscillator.

The phase lock loop 90 comprises a controlled oscillator 106, a controller 104, and a counter/register 92. The controlled oscillator 106 is utilized for generating the generated signal 108. The controlled oscillator 106 is preferably a conventional current-controlled oscillator. It will be appreciated that, alternatively, the controlled oscillator 106 can be a conventional voltage-controlled oscillator. The counter/register 92 counts the cycles of the generated signal 108 to produce a phase error signal 93.

The controller 104 is coupled to the controlled oscillator 106 and coupled to the counter/register 92. The controller 104 preferably includes a processor for processing the phase error signal 93 produced by the counter/register 92. In response to receiving the phase error signal 93, the processor processes the phase error signal 93 to determine a phase correction signal used for generating a control signal 105 for controlling the operation of the controlled oscillator 106.

In determining the phase correction signal, the processor applies the formula $$\frac{S-P}{N} \times 360°,$$

wherein S is a digital representation of the value of the phase error signal 93, P is a predetermined sequential state number corresponding to a desired point of phase lock between the reference signal 109 and the generated signal 108, and wherein N is the digital resolution (as determined by the number of states of the counter/register 92) of the phase error signal 93 generated by the counter/register 92.

For example, let the resolution of the counter/register 92 be N=100 (states), the phase error signal 93 value be S=50, and the desired lock position be P=0. Inserting these numbers into the above equation results in a calculated phase error of $$\frac{50-0}{100} \times 360° = 180°.$$

The processor preferably computes the control signal 105 in response to the phase correction signal by performing a discrete-time digital process. The discrete-time digital process is preferably a digital derivation of a lead-lag filter network conforming to the controller transfer function $$H_{fe}(z) = 1 + \left(\frac{1}{1-z^{-1}}\right).$$

To implement this transfer function, the processor utilizes conventional digital logic hardware. Once the phase correction signal has been applied to the lead-lag filter network, the result is then applied to a conventional current-based digital-to-analog converter (IDAC, not shown), which generates the control signal 105.

Note that during the initial power-up sequence of the phase lock loop 90, the counter/register 92 and the controller 104 are reset by a master reset signal 110. This signal is generated by, for example, a conventional reset circuit such as an RC-delay circuit.

FIG. 2 is a timing diagram depicting the normal, locked and near-locked operation of the counter/register 92. The timing diagram comprises the cycling of N states of the counter/register 92, and the reference signal 109. The reference signal 109 samples one of the states of the counter/register 92, thereby generating the phase error signal 93.

In this example, the resolution of the counter/register 92 is N=8 (i.e., $2^3$=8 states). When the reference signal 109 and the generated signal 108 are phase locked, the phase error signal 93 is ideally equal to the binary sequence "000", which results in a phase error of 0°. In reality, the phase error signal 93 toggles between the binary sequences "000" and "111" when a phase lock has been achieved. The toggling effect creates an average phase error of 0°.

When the reference signal 109 and the generated signal 108 are not precisely phase locked, then the resulting phase error signal 93 is either a positive phase error value or a negative phase error value. The sign of the phase error value is determined from the most significant bit (MSB) of the phase error signal 93. Thus, a phase error signal 93 with a resolution of 3 bits has four phase error values that are negative (i.e., "111", "110", "101", and "100"), and four phase error values that are positive or zero (i.e., "011", 010", 001", and 000").

When the generated signal 108 is at a frequency that cycles the counter/register 92 somewhat faster than the sampling cycle of the reference signal 109, then the value of the phase error signal 93 is a negative phase error value with the binary sequence "1xx". Similarly, when the generated signal 108 is at a frequency that cycles the counter/register 92 somewhat slower than the sampling cycle of the reference signal 109, then the value of the phase error signal 93 is a positive phase error value with the binary sequence "0xx". Both of these examples of phase error value are illustrated in FIG. 2. In the prior art phase lock loop 90 this approach to determining phase error has limited the detectable linear phase error range to ±π. Outside of this range the counter/register 92 produces inaccurate results, as explained below.

Letting $F_{vco}$ represent the frequency of the generated signal 108 and $F_{ref}$ represent the frequency of the reference signal 109, it follows that the frequency at which the counter/register 92 is cycling can be represented by $F_{vco}/N$, where N is equal to the number of states of the counter. Thus, when the cycle frequency of the counter/register 92 is at least 1.5 times faster than the frequency of the reference signal 109 (i.e., $(F_{vco}/N) \geq 1.5 \times F_{ref}$ then the resulting phase error value is inaccurately produced as positive rather than negative (i.e., "0xx" rather than "1xx"). Similarly, when the cycle frequency of the counter/register 92 is 0.5 times slower than the frequency of the reference signal 109 (i.e., $(F_{vco}/N) \leq 0.5 \times F_{ref}$, then the resulting phase error value is inaccurately produced as negative rather than positive (i.e., "1xx" rather than "0xx"). Both cases result in a false phase-frequency measurement.

This limited linear phase error range is depicted in the phase error diagram of FIG. 3. FIG. 3 shows the linear range of the counter/register 92 between ±π. Outside of this range the phase measurement mechanism of the counter/register 92 rolls over to the next cycle depending on the frequency of the generated signal 108. This roll-over effect is illustrated by the periodic nature of the phase error function. A counter/register 92 which exhibits this phase error function severely limits the operating frequency range of the prior art phase lock loop 90, thereby making a simple operation such as, for example, a power-up sequence difficult to control. Thus, to overcome the limitations of the prior art, what is needed is a phase lock loop that has an extended operating frequency range.

Figure 5:
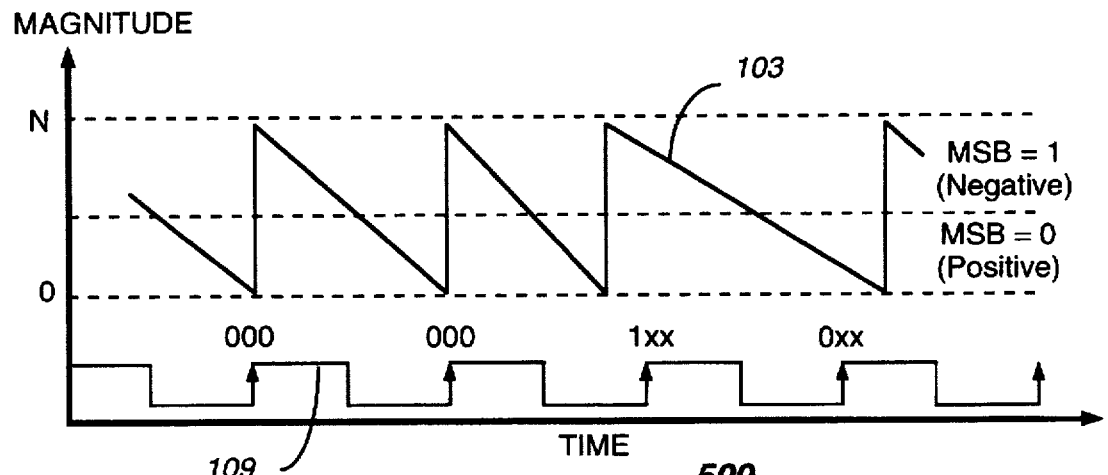
FIG. 5 is a timing diagram depicting the normal, locked and near-locked operation of an instantaneous phase-frequency detector in accordance with the preferred embodiment of the present invention.

FIG. 4 is an electrical block diagram of a phase lock loop 100 in accordance with the preferred embodiment of the present invention. The phase lock loop 100 is similar to the phase lock loop 90, the essential difference being the replacement of the counter/register 92 by the instantaneous phase-frequency detector 102, which produces the phase error signal 103. FIG. 5 is a timing diagram depicting the normal, locked and near-locked operation of the instantaneous phase-frequency detector 102 in accordance with the preferred embodiment of the present invention. Note that under locked and near-locked conditions the behavior of the phase error signal 103 is substantially identical to that of the phase error signal 93 depicted in FIG. 2 for the prior art phase lock loop 90.

Figure 6:
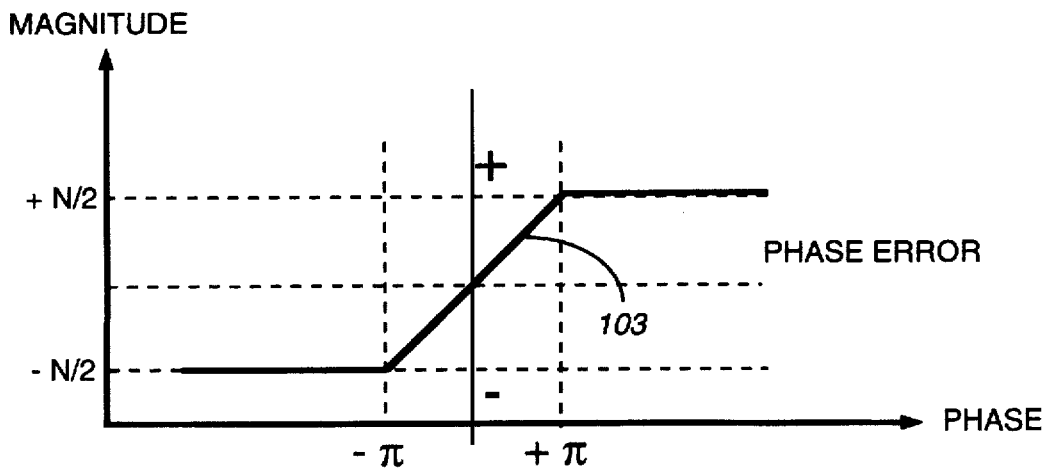
FIG. 6 is a phase error diagram depicting operation of the instantaneous phase-frequency detector with an extended phase error range in accordance with the preferred embodiment of the present invention.

FIG. 6 is a phase error diagram depicting operation of the instantaneous phase-frequency detector 102 with an extended phase error range in accordance with the preferred embodiment of the present invention. Note that outside of the range of ±π, the phase error signal 103 behaves quite differently from the phase error signal 93 depicted in FIG. 3. Circuit elements in the instantaneous phase-frequency detector 102 have been implemented to detect when the phase error value is outside of the range of ±π, and to subsequently modify the captured phase error value to ensure correct operation of the phase lock loop 100. A phase error value that falls beyond +π is substituted with a predetermined positive phase error value, while a phase error value that falls beyond -π is substituted with a predetermined negative phase error value.

Figure 7:
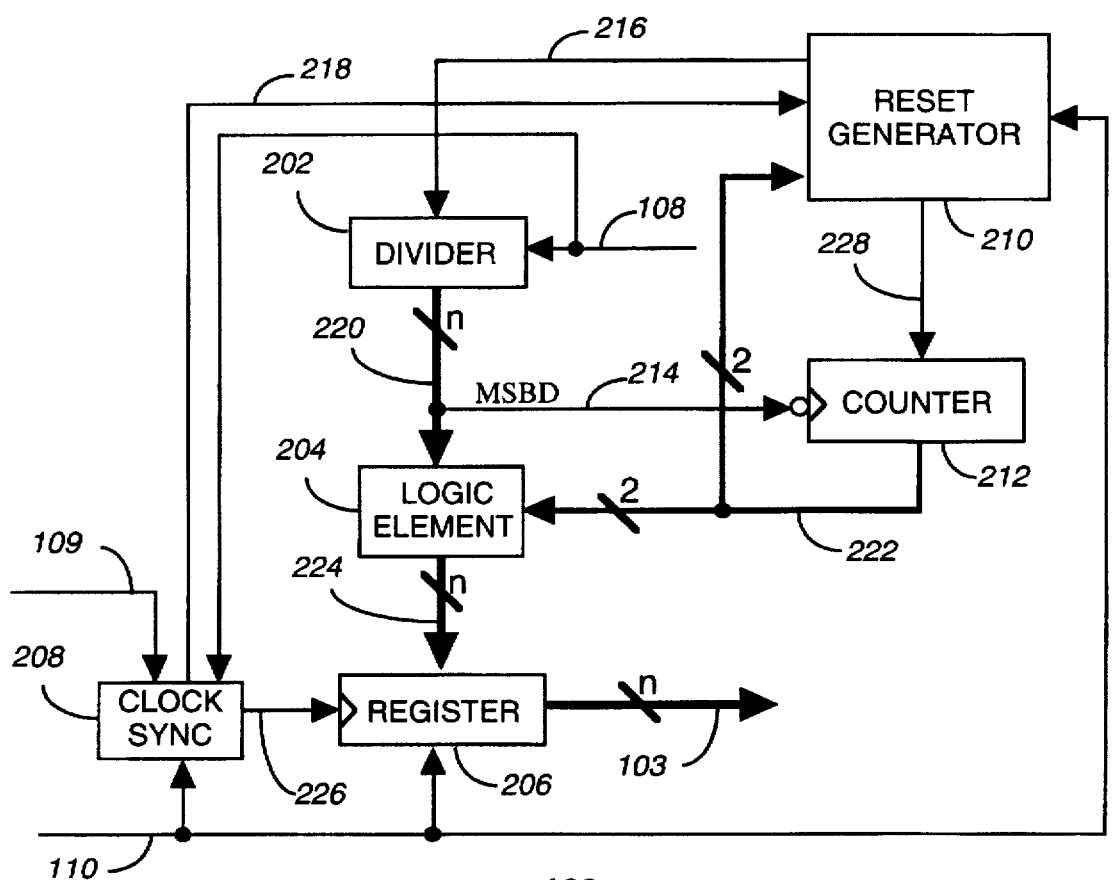
FIG. 7 is an electrical block diagram of the instantaneous phase-frequency detector in accordance with the preferred embodiment of the present invention.

The circuit elements in the instantaneous phase-frequency detector 102 needed to implement the extended operating frequency range depicted by FIG. 6 are shown in FIG. 7 in accordance with the preferred embodiment of the present invention. The instantaneous phase-frequency detector 102 comprises a divider 202, a logic element 204, a counter 212, a register 206, a clock synchronizer 208, and a reset generator 210.

The divider 202 is a conventional digital down counter. It will be appreciated that other conventional counters suitable to this invention can be used. The divider 202 is coupled to the generated signal 108, and a reset B signal 216 generated by the reset generator 210. The reset B signal 216 resets the divider to its highest count value when the phase error range falls outside of ±π. For example, for a three bit down counter this value would be the binary sequence "111" or equivalently the decimal and hexadecimal value 7.

Each rising edge of the generated signal 108 decrements a divider output signal 220 generated by the divider 202. The resolution of the instantaneous phase-frequency detector 102 is depends on the bit width of the divider 202. The wider the bit width of the divider 202 the higher the accuracy of the instantaneous phase-frequency detector 102. The divider 202 is configured such that a divider count of zero corresponds to a zero phase error between the generated signal 108 and the reference signal 109.

The logic element 204 is coupled to the divider 202, and coupled to the output 222 of the counter 212 for controlling the logic element 204. The logic element 204 is used for generating a first phase error signal 224. The logic element 204 is controlled by the counter 212 to write to the register 206 a phase error value based upon the transition count of the most significant bit 214 of the divider output signal 220. When the transition count is equal to unity, the logic element 204 connects the divider output signal 220 with the input of the register 206 for recording. For values different from unity, the logic element 204 generates a constant phase error value indicating that the frequency of the generated signal 108 is operating either below the -π phase error value or above the +π phase error value depicted in FIG. 6.

The counter 212 is coupled to the divider 202 for recording a transition count determined by how many transitions of a predetermined direction occur in the most significant bit (MSB) 214 of the divider 202 during a cycle of the reference signal 109. The counter 212 is a conventional two bit digital counter that operates on the falling edge of the MSB 214 of the divider 202. The counter is designed not to roll-over when it has reached its maximum count (i.e., 3 or "11" in binary). This feature is necessary to account for cases where the frequency of the generated signal 108 is excessively fast and can cycle the counter 212 more than three times before the next transition of the reference signal 109.

Thus, for N=3 the counter 212 increments by one for every transition from "100" to "011". If the divider 202 is cycling ≥ 1.5 times faster than a cycle of the reference signal 109, then the counter 212 will record two or more transitions. In contrast, if the divider 202 is cycling ≤0.5 times slower than a cycle of the reference signal 109, then the counter 212 will record no transitions prior the next cycle of the reference signal 109. The counter 212 is also coupled to a reset A signal 228 generated by the reset generator 210. The reset A signal 228 is asserted after every cycle of the reference signal 109.

The register 206 is coupled to the first phase error signal 224 of the logic element 204 for receiving a phase error value corresponding to the count of the divider 202 coincident with a predetermined transition of the reference signal 109, in response to the transition count being equal to unity. The register 206 is further coupled to the controller 104 by way of the phase error signal 103 for delivering the phase error value thereto. The register 206 is a conventional edge-triggered register for recording digitized samples.

The clock synchronizer 208 is used for synchronizing the reference signal 109 with the generated signal 108, thereby generating a reference sync signal 226 coupled to the clock input of the register 206. On the rising edge of the reference sync signal 226, the register 206 records the first phase error signal 224. The clock synchronizer 208 also generates a reset sync signal 218 after the reference sync signal 226 has been deasserted. This signal is used by the reset generator 210 to invoke the reset A and reset B signals 228, 216.

The reset generator 210 generates the reset A and reset B signals 228, 216 to reset the counter 212 and the divider 202, respectively. The reset A signal 228 resets the counter 212 every cycle of the reference signal 109. The reset B signal 216 resets the divider 202 at least one full cycle of the generated signal 108 after the predetermined transition of the reference sync signal 226. The reset signal B216 is invoked only when the value of the output 222 of the counter 212 is not equal to unity, i.e., "01". Note that during the power-up sequence of the phase lock loop 100, the clock synchronizer 208, the register 206, and the reset generator 210 are reset by the master reset signal 110.

Figure 8:
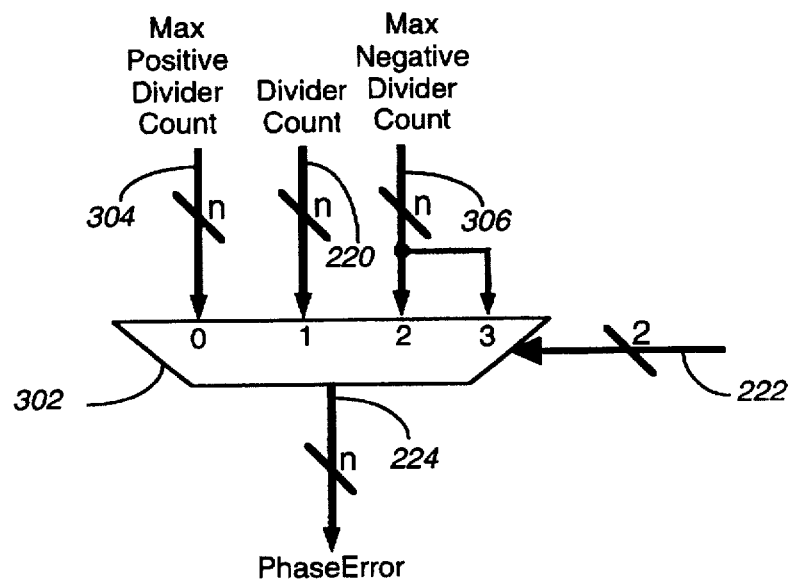
FIG. 8 is an electrical block diagram of a logic element in accordance with the preferred embodiment of the present invention.

FIG. 8 is an electrical block diagram of the logic element 204 in accordance with the preferred embodiment of the present invention. The logic element 204 comprises a 4 to 1 multiplexer 302. The select lines of the multiplexer 302 are controlled by the output 222 of the counter 212. The first input of the multiplexer 302 is hard-wired to a binary constant representing a maximum positive divider count 304 (e.g., "011" for N=3). The second input of the multiplexer 302 is coupled to the divider output signal 220. The third and fourth inputs are hard-wired to a binary constant representing a maximum negative divider count 306 (e.g., "100" for N=3).

Thus, when the output 222 of the counter 212 is set to zero, in response to the transition count being equal to zero, the phase error value of the first phase error signal 224 corresponds to a first predetermined value for increasing the generated frequency of the generated signal 108. The first predetermined value preferably corresponds to the maximum positive divider count 304. When the output 222 of the counter 212 is set to one, the first phase error signal 224 is set to the divider output signal 220 for adjusting the frequency of the generated signal 108 accordingly. When the output 222 of the counter 212 is set to two or more, in response to the transition count being greater than unity, the phase error value of the first phase error signal 224 corresponds to a second predetermined value for increasing the generated frequency of the generated signal 108. The second predetermined value preferably corresponds to the maximum negative divider count 306. It will be appreciated that, alternatively, other values can be selected for the first and second predetermined values.

Figure 9:
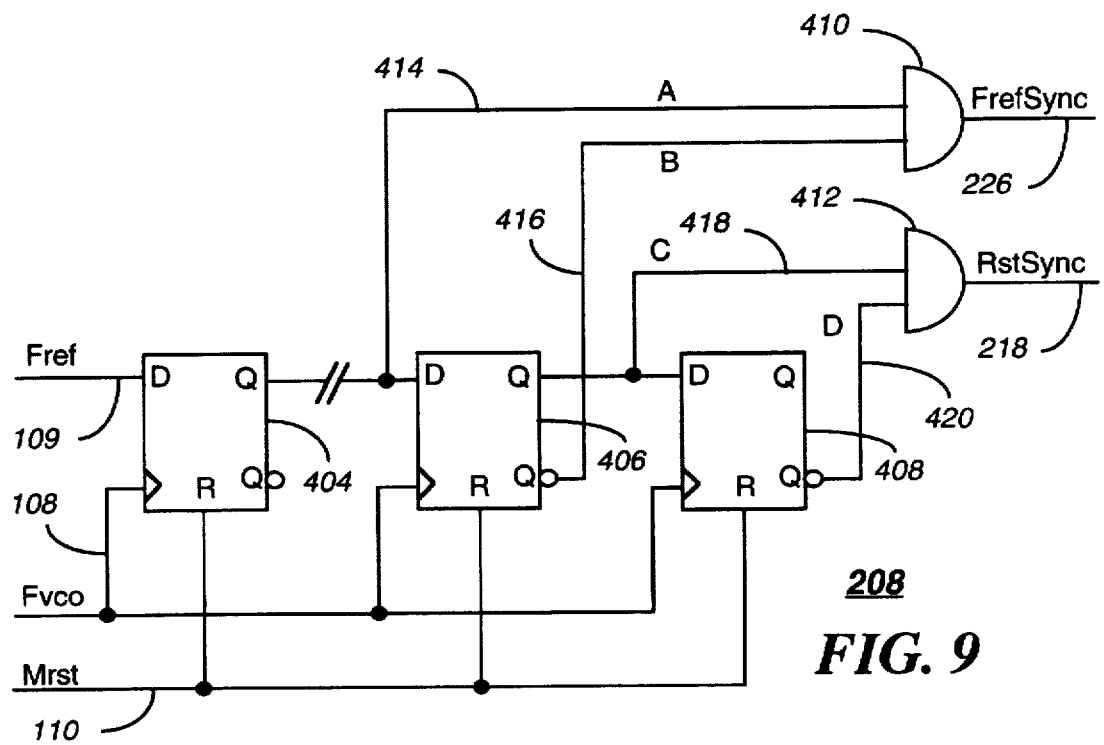
FIG. 9 is an electrical block diagram of a clock synchronizer in accordance with the preferred embodiment of the present invention.

FIG. 9 is an electrical block diagram of the clock synchronizer 208 in accordance with the preferred embodiment of the present invention. The clock synchronizer 208 comprises three conventional flip-flops 404, 406, 408 having asynchronous reset inputs. The clock synchronizer 208 further comprises two "AND" gates 410, 412 for generating the reference sync signal 226, and the reset sync signal 218, respectively. The clock input and the reset input of each flip-flop 404, 406, 408 are coupled to the generated signal 108 (shown as Fvco), and the master reset signal 110 (shown as Mrst), respectively. The non-inverting output of each flip-flop 404, 406, 408 is coupled to the data input of the succeeding flip-flop. The first "AND" gate 410 is coupled to the non-inverting output 414 (shown as "A") of the first flip-flop 404, and the inverting output 416 (shown as "B") of the second flip-flop 406. The second "AND" gate is coupled to the non-inverting output 418 (shown as "C") of the second flip-flop 406, and the inverting output 420 (shown as "D") of the third flip-flop 408.

The data input of the first flip-flop 404 is coupled to the reference signal 109 (shown as Fref). This flip-flop is used for synchronizing the reference signal 109 to the generated signal 108. To prevent metastability, at least two flip-flops are used at this stage as indicated by the dashed lines after the non-inverting output of the first flip-flop 404. Depending on the fabrication process chosen, more flip-flops may be necessary. The more stages that are added to the synchronization stage the more delay is added to the reference sync signal 226. This delay degrades the accuracy of the phase error signal 103 generated by the instantaneous phase-frequency detector 102. However, for an instantaneous phase-frequency detector 102 that employs a resolution of, e.g., N-=12 bits, the inaccuracy of resynchronizing the reference signal 109 to the generated signal 108 is negligible (e.g., <1%). The functionality of the clock synchronizer 208 is explained below by way of the timing diagram of FIG. 11.

Figure 10:
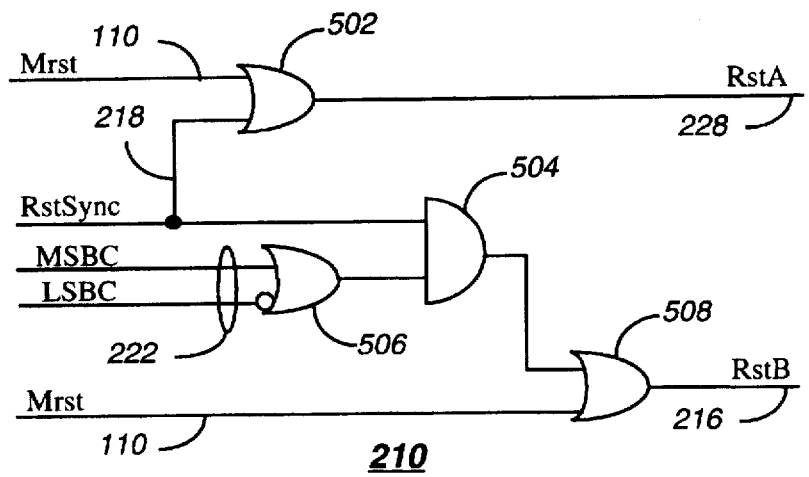
FIG. 10 is an electrical block diagram of a reset generator in accordance with the preferred embodiment of the present invention.

FIG. 10 is an electrical block diagram of the reset generator 210 in accordance with the preferred embodiment of the present invention. The reset generator 210 comprises three "OR" gates 502, 506, 508 and one "AND" gate 504. The inputs of the first "OR" gate 502 are coupled to the master reset signal 110 (shown as Mrst) and the reset sync signal 218 (shown as RstSync). A non-inverting input of the second "OR" gate 506 is coupled to the most significant bit of the counter 212 (shown as MSBC). An inverting input of the second "OR" gate 506 is coupled to the least significant bit of the counter 212 (shown as LSBC). The inputs of the "AND" gate 504 are coupled to the reset sync signal 218 and the output of the second "OR" gate 506. The inputs of the third "OR" gate 508 are coupled to the output of the "AND" gate 504 and the master reset signal 110. The first "OR" gate 502 generates the reset A signal 228. The third "OR" gate 508 generates the reset B signal 216. The functionality of the reset generator 210 is shown in the timing diagram of FIG. 11.

Figure 11:
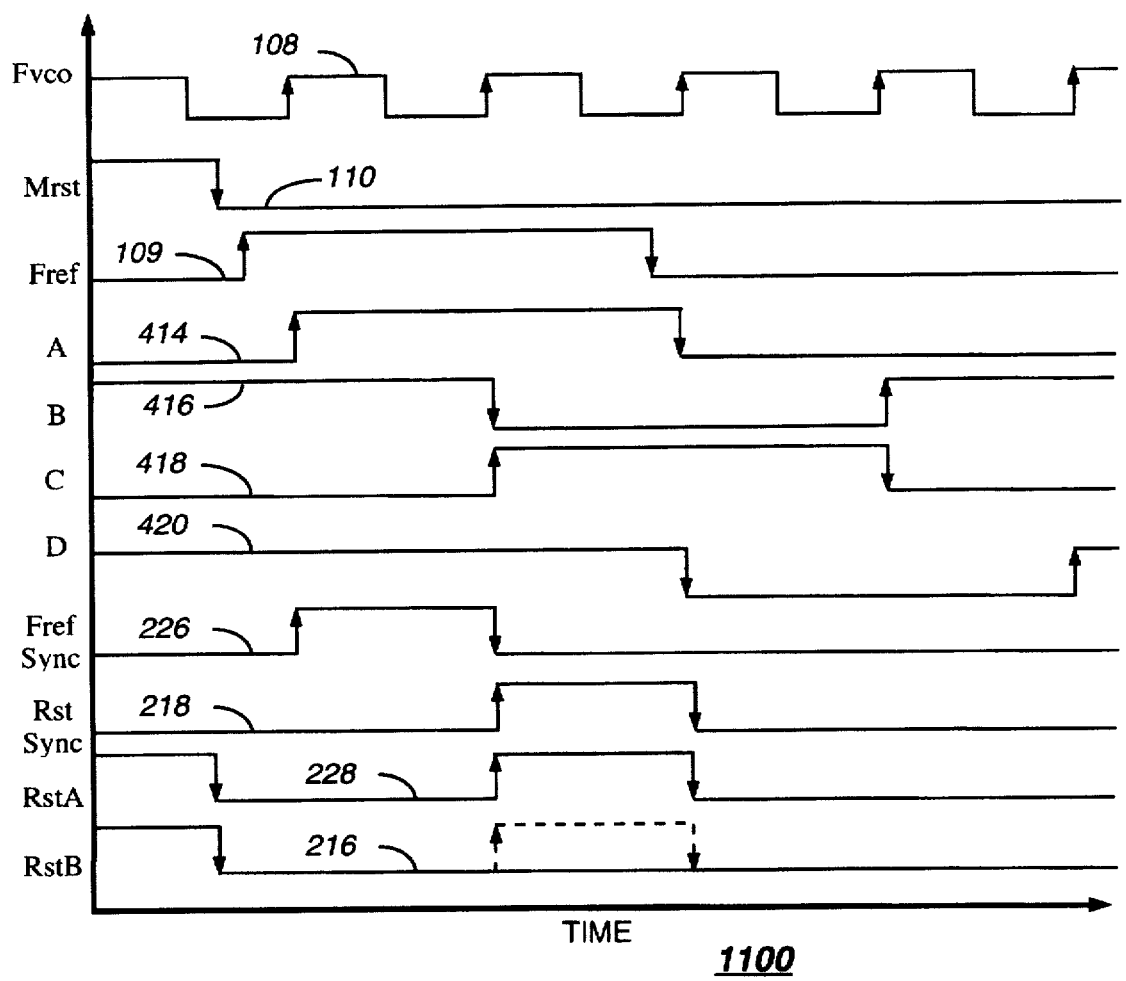
FIG. 11 is a timing diagram depicting the operation of the clock synchronizer and reset generator in accordance with the preferred embodiment of the present invention.

FIG. 11 is a timing diagram 1100 depicting the operation of the clock synchronizer 208 and reset generator 210 in accordance with the preferred embodiment of the present invention. The timing diagram 1100 comprises signals including the generated signal 108 (Fvco), the master reset signal 110 (Mrst), the reference signal 109 (Fref), the inputs to the first "AND" gate 410 of the clock synchronizer 208 ("A" and "B"), the inputs of the second "AND" gate of the clock synchronizer 208 ("C" and "D"), reference sync signal 226 (FrefSync), the reset sync signal 218 (RstSync), and the reset A and B signals 228, 216 (RstA, RstB).

The timing diagram 1100 begins with the master reset signal 110 resetting the flip-flops of the clock synchronizer 208, and the reset A and B signals 228, 216. The timing diagram 1100 follows with the first rising edge transition of the reference signal 109. On the next rising edge of the generated signal 108, the reference signal 109 is sampled by the first flip-flop 404 of the clock synchronizer 208, thereby asserting the non-inverting output 414 ("A") of the first flip-flop 404. This in turn asserts the reference sync signal 226. On the following clock cycle of the generated signal 108, the inverting output 416 ("B") of the second flip-flop 406 is cleared after sampling the non-inverting output 414 ("A") of the first flip-flop 404. The deassertion of the inverting output 416 ("B") results in the deassertion of the reference sync signal 226.

On the same clock cycle, the reset sync signal 218 is asserted from the assertion of the non-inverting output 418 ("C") of the second flip-flop 406. The assertion of the reset sync signal 218 results in the assertion of the reset A signal 228. Depending on the value of the output 222 of the counter 212, the reset B signal is either asserted or remains unasserted. If the output 222 value of the counter 212 is equal to one, then the reset B signal 216 remains unasserted; otherwise, the reset B signal 216 is asserted. Finally, on the next clock cycle of the generated signal 108, the third flip-flop 408 samples the non-inverting output 418 of the second flip-flop 406, which results in the deassertion of the inverting output 420 ("D") of the third flip-flop 408. This invokes the deassertion of the reset sync signal 218, the reset A signal 228, and the reset B signal 216 (if it had been asserted). The above described cycle of assertion and deassertion of the output signals of the clock synchronizer 208 and the reset generator 210 is invoked every periodic cycle of the reference signal 109.

In summary, the divider 202 counts cycles of the generated signal 108. The divider output signal 220 is then sampled by the reference sync signal 226 and recorded in the register 206 as long as the frequency of the generated signal 108 is operating within the linear region (±π) of the divider 202. The counter 212 along with the logic element 204 is utilized to detect instances where the phase sample falls out of the linear region ±π. When this occurs, the logic element 204 generates a maximum negative divider count 306 when the frequency of the generated signal 108 is excessively fast, or a maximum positive divider count 304 when the frequency of the generated signal 108 is excessively slow. Once the phase detection process has been completed, the reset generator 210 resets the counter 212, and the divider 202 if the frequency of the generated signal 108 is operating outside of the linear region of the divider 202. This process repeats every cycle of the reference signal 109.

One of ordinary skill in the art will appreciate that many alternative embodiments in accordance with the present invention are possible. For example, an alternative embodiment can be designed such that a predetermined value (other than zero) for the divider count corresponds to a zero phase error between the generated signal 108 and the reference signal 109. In this alternative embodiment the counter 212 would have to be modified to count the times that the divider count passes through a count equal to the predetermined value, offset by one-half the resolution of the divider 202. For example, if the divider 202 has a resolution of 100 states, and the predetermined value is 25, then the counter 212 would have to be modified to count the times that the divider count passes through 75. In addition, the phase error value recorded from the divider count would have to be corrected by the predetermined value (in this example, 25 would be subtracted from the recorded divider count), so that the predetermined value would translate to a zero phase error. While this alternative embodiment would be somewhat more complex than the preferred embodiment, it represents a workable approach that could be used if for some reason it is desired to have a predetermined divider count value different from zero correspond to a zero phase error between the generated signal 108 and the reference signal 109. This and other similar alternative embodiments are considered to fall well within the scope and intent of the claimed invention.

Thus, it should now be apparent that the present invention provides a novel method and apparatus for extending the operating frequency range of an instantaneous phase-frequency detector. In particular, the present invention advantageously extends the operating frequency range of a phase lock loop employing the instantaneous phase-frequency detector. Thus, even during an initial power-up sequence the instantaneous phase-frequency detector provides a proper indication to the controller as to the direction in which the controlled oscillator must be adjusted. The present invention further resolves the deficiencies of prior art systems by utilizing a digital circuit solution instead of a loop biasing circuit that employs analog technology. By utilizing a digital circuit solution, manufacturing defects can be significantly reduced, thereby lowering the overall cost of the phase lock loop.

What is claimed is:

1. A method for extending an operating frequency range of an instantaneous phase-frequency detector having a divider, a counter, and a register, the method comprising the steps of:

configuring the instantaneous phase-frequency detector such that a divider count of zero in the divider corresponds to a zero phase error between a generated signal operating at a generated frequency and a reference signal operating at a reference frequency;

recording in the counter a transition count determined by how many transitions of a predetermined direction occur in a most significant bit of the divider during a cycle of the reference signal; and writing into the register a phase error value, wherein the phase error value corresponds to the divider count coincident with a predetermined transition of the reference signal, in response to the transition count being equal to unity, and wherein the phase error value is based upon the transition count, in response to the transition count being different from unity.

2. The method of claim 1, wherein the phase error value corresponds to a first predetermined value for increasing the generated frequency, in response to the transition count being equal to zero.

3. The method of claim 2, wherein the first predetermined value corresponds to a maximum positive divider count.

4. The method of claim 1, wherein the phase error value corresponds to a second predetermined value for decreasing the generated frequency, in response to the transition count being greater than unity.

5. The method of claim 4, wherein the second predetermined value corresponds to a maximum negative divider count.

6. The method of claim 1, further comprising a step of:

resetting the divider after the predetermined transition of the reference signal, in response to the transition count being different from unity.

7. The method of claim 6, wherein the resetting step occurs at least one full cycle of the generated signal after the predetermined transition of the reference signal.

8. An instantaneous phase-frequency detector having an extended operating frequency range, the detector comprising:
- a divider coupled to a generated signal operating at a generated frequency for counting transitions of the generated signal, the divider configured such that a divider count of zero corresponds to a zero phase error between the generated signal and a reference signal operating at a reference frequency;
- a logic element coupled to the divider and coupled to a counter for controlling the logic element;
- the counter coupled to the divider for recording a transition count determined by how many transitions of a predetermined direction occur in a most significant bit of the divider during a cycle of the reference signal; and
- a register coupled to the logic element for receiving a phase error value,
- wherein the phase error value corresponds to the divider count coincident with a predetermined transition of the reference signal, in response to the transition count being equal to unity, and
- wherein the phase error value is based upon the transition count, in response to the transition count being different from unity.

9. The instantaneous phase-frequency detector of claim 8, wherein the phase error value corresponds to a first predetermined value for increasing the generated frequency, in response to the transition count being equal to zero.

10. The instantaneous phase-frequency detector of claim 9, wherein the first predetermined value corresponds to a maximum positive divider count.

11. The instantaneous phase-frequency detector of claim 8, wherein the phase error value corresponds to a second predetermined value for decreasing the generated frequency, in response to the transition count being greater than unity.

12. The instantaneous phase-frequency detector of claim 11, wherein the second predetermined value corresponds to a maximum negative divider count.

13. The instantaneous phase-frequency detector of claim 8, further comprising:
- a reset generator coupled to the divider and coupled to the counter for resetting the divider after the predetermined transition of the reference signal, in response to the transition count being different from unity.

14. The instantaneous phase-frequency detector of claim 13, wherein the reset generator resets the divider at least one full cycle of the generated signal after the predetermined transition of the reference signal.

15. A phase lock loop having an extended operating frequency range, comprising:
- a controlled oscillator for generating a generated signal operating at a generated frequency;
- a controller coupled to the controlled oscillator for controlling the controlled oscillator; and
- an instantaneous phase-frequency detector, comprising:
  - a divider coupled to controlled oscillator for counting transitions of the generated signal, the divider configured such that a divider count of zero corresponds to a zero phase error between the generated signal and a reference signal operating at a reference frequency;
  - a logic element coupled to the divider and coupled to a counter for controlling the logic element;
  - the counter coupled to the divider for recording a transition count determined by how many transitions of a predetermined direction occur in a most significant bit of the divider during a cycle of the reference signal; and
  - a register coupled to the logic element for receiving a phase error value,
  - wherein the phase error value corresponds to the divider count coincident with a predetermined transition of the reference signal, in response to the transition count being equal to unity,
  - wherein the register further coupled to the controller for delivering the phase error value thereto, and
  - wherein the phase error value is based upon the transition count, in response to the transition count being different from unity.

16. The phase lock loop of claim 15, wherein the phase error value corresponds to a first predetermined value for increasing the generated frequency, in response to the transition count being equal to zero.

17. The phase lock loop of claim 16, wherein the first predetermined value corresponds to a maximum positive divider count.

18. The phase lock loop of claim 15, wherein the phase error value corresponds to a second predetermined value for decreasing the generated frequency, in response to the transition count being greater than unity.

19. The phase lock loop of claim 18, wherein the second predetermined value corresponds to a maximum negative divider count.

20. The phase lock loop of claim 15, further comprising:
- a reset generator coupled to the divider and coupled to the counter for resetting the divider after the predetermined transition of the reference signal, in response to the transition count being different from unity.

21. The phase lock loop of claim 20, wherein the reset generator resets the divider at least one full cycle of the generated signal after the predetermined transition of the reference signal.

22. A method for extending an operating frequency range of an instantaneous phase-frequency detector including a counter, a register, and a divider having a resolution, the method comprising the steps of:
- configuring the instantaneous phase-frequency detector such that a predetermined value of a divider count in the divider corresponds to a zero phase error between a generated signal operating at a generated frequency and a reference signal operating at a reference frequency;
- recording in the counter a pass count determined by how many times the divider count passes through a count equal to the predetermined value, offset by one-half the resolution of the divider, during a cycle of the reference signal;
- writing into the register a phase error value,
- wherein the phase error value corresponds to the divider count coincident with a predetermined transition of the reference signal, in response to the pass count being equal to unity; and
- wherein the phase error value is based upon the pass count, in response to the pass count being different from unity.

23. The method of claim 22, wherein the phase error value corresponds to a first predetermined value for increasing the generated frequency, in response to the pass count being equal to zero.

24. The method of claim 22, wherein the phase error value corresponds to a second predetermined value for decreasing the generated frequency, in response to the pass count being greater than unity.

* * * * *